United States Patent
Lien et al.

(10) Patent No.: US 11,875,842 B2
(45) Date of Patent: Jan. 16, 2024

(54) SYSTEMS AND METHODS FOR STAGGERING READ OPERATION OF SUB-BLOCKS

(71) Applicant: SanDisk Technologies LLC, Addison, TX (US)

(72) Inventors: Yu-Chung Lien, San Jose, CA (US); Deepanshu Dutta, Fremont, CA (US); Tai-Yuan Tseng, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 50 days.

(21) Appl. No.: 17/522,414

(22) Filed: Nov. 9, 2021

(65) Prior Publication Data

US 2023/0146549 A1     May 11, 2023

(51) Int. Cl.
| | | |
|---|---|---|
| *G11C 7/12* | (2006.01) | |
| *G11C 11/4096* | (2006.01) | |
| *G11C 11/408* | (2006.01) | |
| *G11C 11/4074* | (2006.01) | |
| *G11C 11/4076* | (2006.01) | |

(52) U.S. Cl.
CPC ...... *G11C 11/4096* (2013.01); *G11C 11/4074* (2013.01); *G11C 11/4076* (2013.01); *G11C 11/4085* (2013.01); *G11C 11/4087* (2013.01)

(58) Field of Classification Search
CPC .................................................. G11C 16/0483
See application file for complete search history.

(56) References Cited

U.S. PATENT DOCUMENTS

| | | | | |
|---|---|---|---|---|
| 5,963,475 A | * | 10/1999 | Choi ..................... | G11C 16/34 |
| | | | | 365/185.11 |
| 6,813,677 B1 | * | 11/2004 | Gupta ..................... | G11C 8/00 |
| | | | | 365/230.09 |
| 2015/0149710 A1 | * | 5/2015 | Oh ......................... | H10B 43/35 |
| | | | | 711/103 |
| 2019/0196744 A1 | * | 6/2019 | Kim ...................... | G06F 3/0616 |
| 2019/0371406 A1 | * | 12/2019 | Yang ................... | G11C 11/5671 |
| 2021/0249087 A1 | * | 8/2021 | Oh ......................... | G11C 16/16 |
| 2022/0415398 A1 | * | 12/2022 | Lien ...................... | G11C 16/08 |
| 2023/0023618 A1 | * | 1/2023 | Zhang ................. | G11C 16/3445 |

* cited by examiner

*Primary Examiner* — Mushfique Siddique

(74) *Attorney, Agent, or Firm* — Dickinson Wright PLLC

(57) ABSTRACT

A memory device with one or more planes having sub-blocks is disclosed. The memory device may further include a voltage switch transistor for each of sub-blocks. Additionally, the memory device may further include a row decoder for each of sub-blocks. As a result, an operation to two sub-blocks can be performed at different times. For example, using a row decoder and voltage switch transistor, a sub-block can be initially read, followed by a subsequent read of another sub-block using a separate row decoder and voltage switch transistor. By staggering the read operations through a time delay, the peak current Icc associated with the supply voltage can be reduced.

14 Claims, 15 Drawing Sheets

1100

| [3] | [2] | [1] | [0] | Time (μs) |
|---|---|---|---|---|
| 0 | 0 | 0 | 0 | x |
| 0 | 0 | 0 | 1 | 2x |
| 0 | 0 | 1 | 0 | 3x |
| 0 | 0 | 1 | 1 | 4x |
| 0 | 1 | 0 | 0 | 5x |
| 0 | 1 | 0 | 1 | 6x |
| 0 | 1 | 1 | 0 | 7x |
| 0 | 1 | 1 | 1 | 8x |
| 1 | 0 | 0 | 0 | 9x |
| 1 | 0 | 0 | 1 | 10x |
| 1 | 0 | 1 | 0 | 11x |
| 1 | 0 | 1 | 1 | 12x |
| 1 | 1 | 0 | 0 | 13x |
| 1 | 1 | 0 | 1 | 14x |
| 1 | 1 | 1 | 0 | 15x |
| 1 | 1 | 1 | 1 | 16x |

*FIG. 11*

SYSTEMS AND METHODS FOR STAGGERING READ OPERATION OF SUB-BLOCKS

TECHNICAL FIELD

This application is directed to staggering operations performed to sub-blocks. In particular, this application is directed to implementing a time delay such that one sub-block is read before another sub-block, with the duration between read operations based on the time delay.

BACKGROUND

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

In a three-dimensional (3D) memory structure, the memory cells may be arranged in vertical strings in a stack where the stack comprises alternating conductive and dielectric layers. The conductive layers act as word lines which are connected to the memory cells. Strings of memory cells may be formed by drilling memory holes through a stack of alternating silicon oxide and sacrificial layers, replacing the memory holes with annular films of memory cell materials. The conductive layers serve as both the word lines as well as control gates of the memory cells. The annular films may include a blocking layer adjacent to the control gate, a charge storage region, a tunnel dielectric, and a channel (or body).

As memory devices evolve, certain advances can be implemented. For example, new generations of memory device can increase the number of word lines layers, thereby increasing the overall memory storage capacity. When the word line layers increase, the word line memory hole ("WL-MH") capacitance increases as well as the peak current Icc associated with the supply voltage ("Vcc"). The increased peak current is generally undesirable.

SUMMARY

According to an aspect of the present disclosure is related to a method for accessing a block of a memory device. The method includes the steps of accessing, by a first row decoder, a first sub-block of a first memory block at a first time. The steps further include accessing, by a second row decoder, a second sub-block of a second memory block at a second time that is different from the first time.

In an embodiment, the second time defines a time delay that is chronologically after the first time.

In an embodiment, the time delay is determined based upon a word line voltage ramp rate control.

In an embodiment, accessing the first sub-block includes reading the first sub-block at the first time, and accessing the second sub-block includes reading the second sub-block at the second time.

In an embodiment, accessing the first sub-block comprises providing, by the first row decoder, voltage to a first switch transistor.

In an embodiment, the first sub-block is located on a first plane, and the second sub-block is located on a second plane.

In an embodiment, the steps further include providing, by a voltage switch transistor, voltage to the first row decoder and the second row decoder.

According to another aspect of the disclosure, a memory system includes a memory device. The memory system further includes a controller operatively coupled to the memory device. The controller is configured to access, by a first row decoder, a first sub-block of a first memory block at a first time. The controller is configured further to access, by a second row decoder, a second sub-block of a second memory block at a second time that is different from the first time.

In an embodiment, the second time defines a time delay that is chronologically after the first time.

In an embodiment, the time delay is determined based upon a word line voltage ramp rate control.

In an embodiment, the controller is configured further to access read the first sub-block at the first time, and read the second sub-block at the second time.

In an embodiment, the controller is configured further to access the first sub-block and provide, by the first row decoder, voltage to a first switch transistor.

In an embodiment, the first sub-block is located on a first plane, and the second sub-block is located on a second plane.

According to another aspect of the disclosure, a non-transitory computer readable storage medium configured to store instructions that, when executed by a processor includes a controller of a memory system, cause the memory system to carry out steps to access, by a first row decoder, a first sub-block of a first memory block at a first time. The controller is configured further to access, by a second row decoder, a second sub-block of a second memory block at a second time that is different from the first time.

In an embodiment, the second time defines a time delay that is chronologically after the first time.

In an embodiment, the time delay is determined based upon a word line voltage ramp rate control.

In an embodiment, the controller is configured further to access read the first sub-block at the first time, and read the second sub-block at the second time.

In an embodiment, the controller is configured further to access the first sub-block and provide, by the first row decoder, voltage to a first switch transistor.

In an embodiment, the first sub-block is located on a first plane, and the second sub-block is located on a second plane.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 11 illustrates a table showing exemplary time delays, in accordance with some described embodiments.

DETAILED DESCRIPTION

Figure 1A:
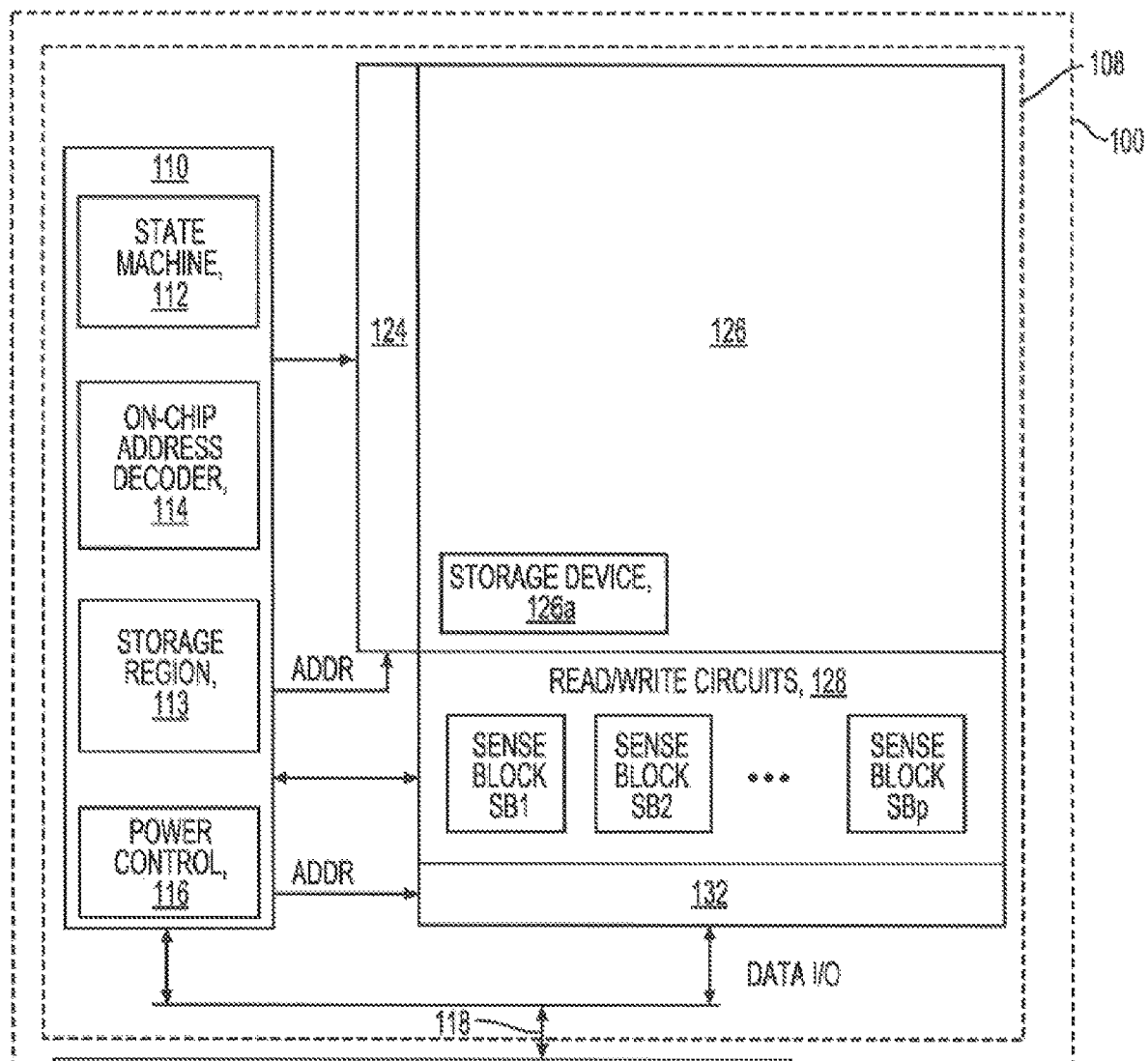
FIG. 1A is a block diagram of an example memory device.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is related to reducing the peak supply current Icc associated with the Vcc. Memory systems described herein may include memory blocks, with at least one or more memory blocks divided into sub-blocks. Additionally, memory systems described herein may include both a row decoder and a switching transistor for each sub-block. As a result, operations (e.g., read operations) to the sub-blocks can be performed individually. Moreover, a time delay can be incorporated such that one sub-block is read after another sub-block with the subsequent reading occurring based on the time delay. The delayed operations (i.e., staggering) provides several advantages, including reducing the peak supply current Icc.

In addition to the time delay, additional parameters may be adjusted to reduce the peak supply current Icc. For example, the word line ramp rate control ("RRC_VREAD") can also be adjusted to further reduce the peak supply current Icc. Also, not only can the time delay be applied to sub-blocks of different blocks, but also among different sets of sub-blocks on different planes.

While the read time ("Tread") can increase for a give read operation, the reduced peak supply current Icc provides sufficient benefits. Various experimental read times can be empirically used to determine a minimized peak supply current Icc. By providing modifications to reduce the peak supply current Icc, new generations of memory systems (e.g., BiCS6, BiCS7, and BiCS8) can provide additional word line layers for additional memory capacity, while also preventing unwanted current spikes.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
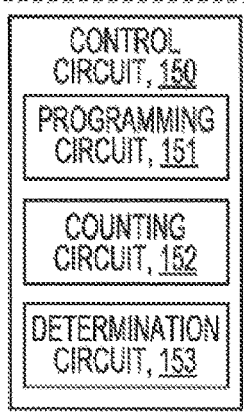
FIG. 1B is a block diagram of an example control circuit that includes a programming circuit, a counting circuit, and a determination circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
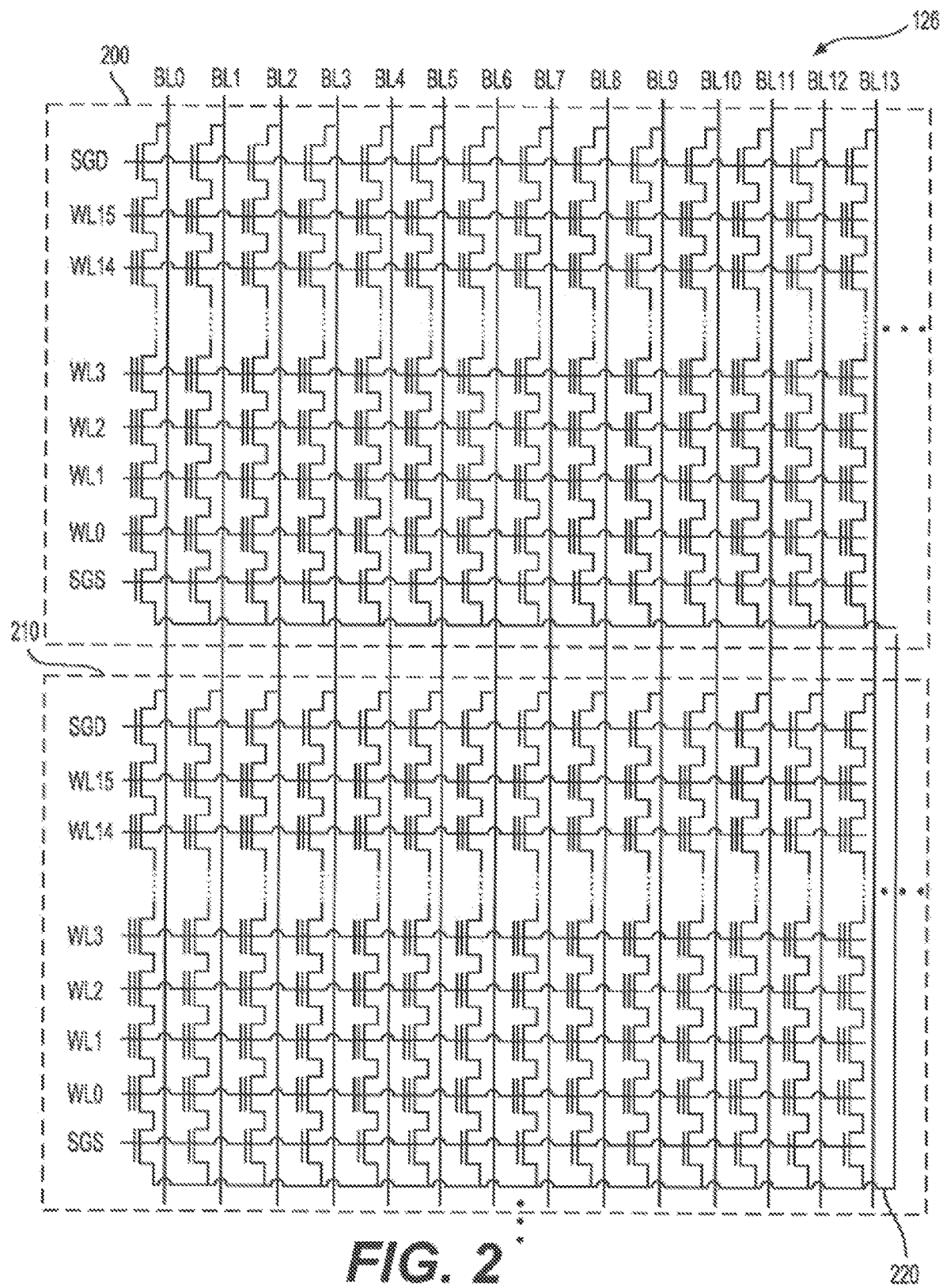
FIG. 2 illustrates schematic views of three types of memory architectures utilizing staggered memory strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
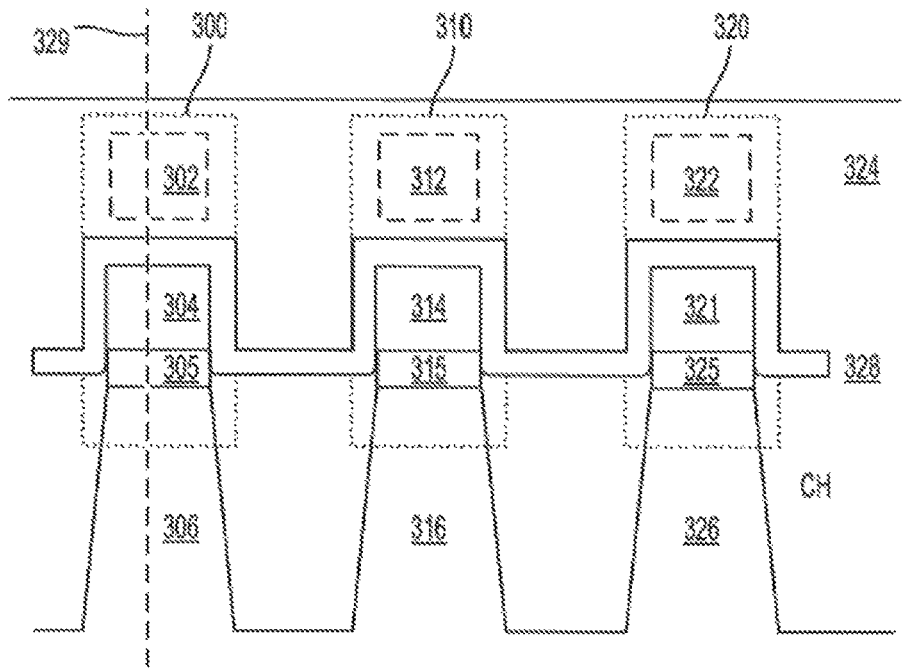
FIG. 3A illustrates a cross-sectional view of example floating gate memory cells in NAND strings.
Figure 3B:
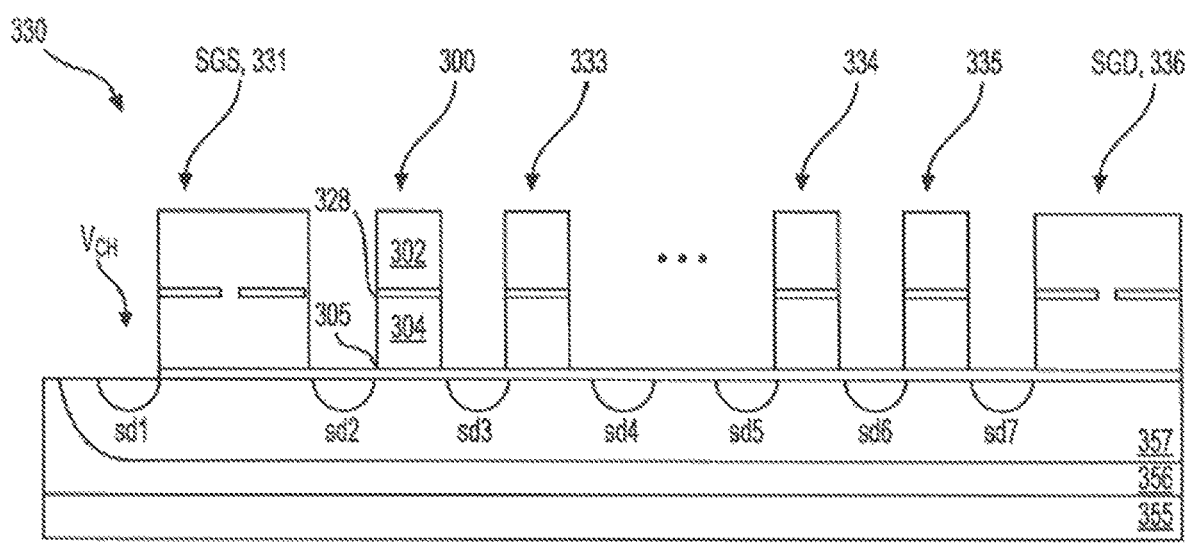
FIG. 3B illustrates a cross-sectional view along a contact line shown in FIG. 3A.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
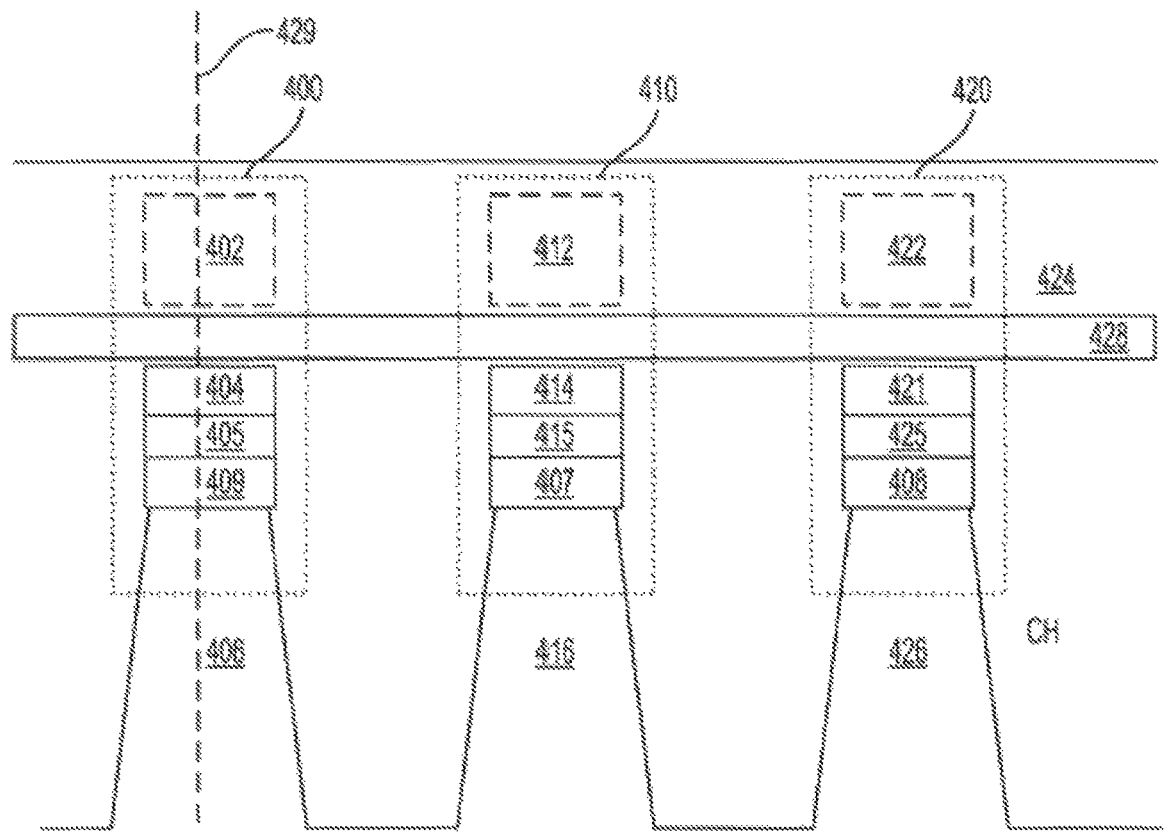
FIGS. 4A and 4B illustrate non-volatile memory in which a charge-trapping memory cell uses a non-conductive dielectric material in place of a conductive floating gate to store charge in a non-volatile manner.
Figure 4B:
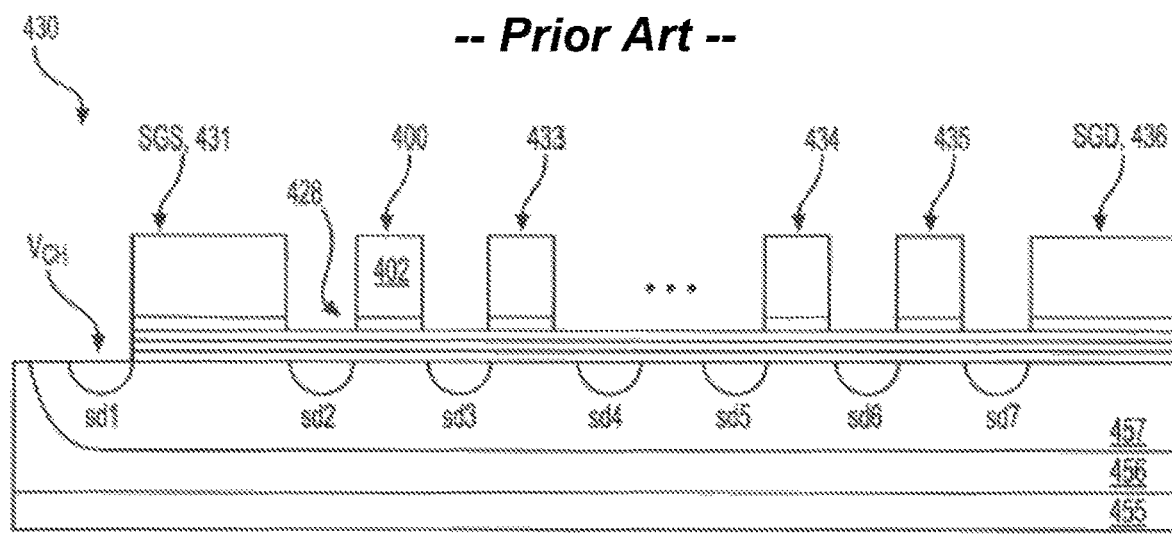

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as a SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, ... 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
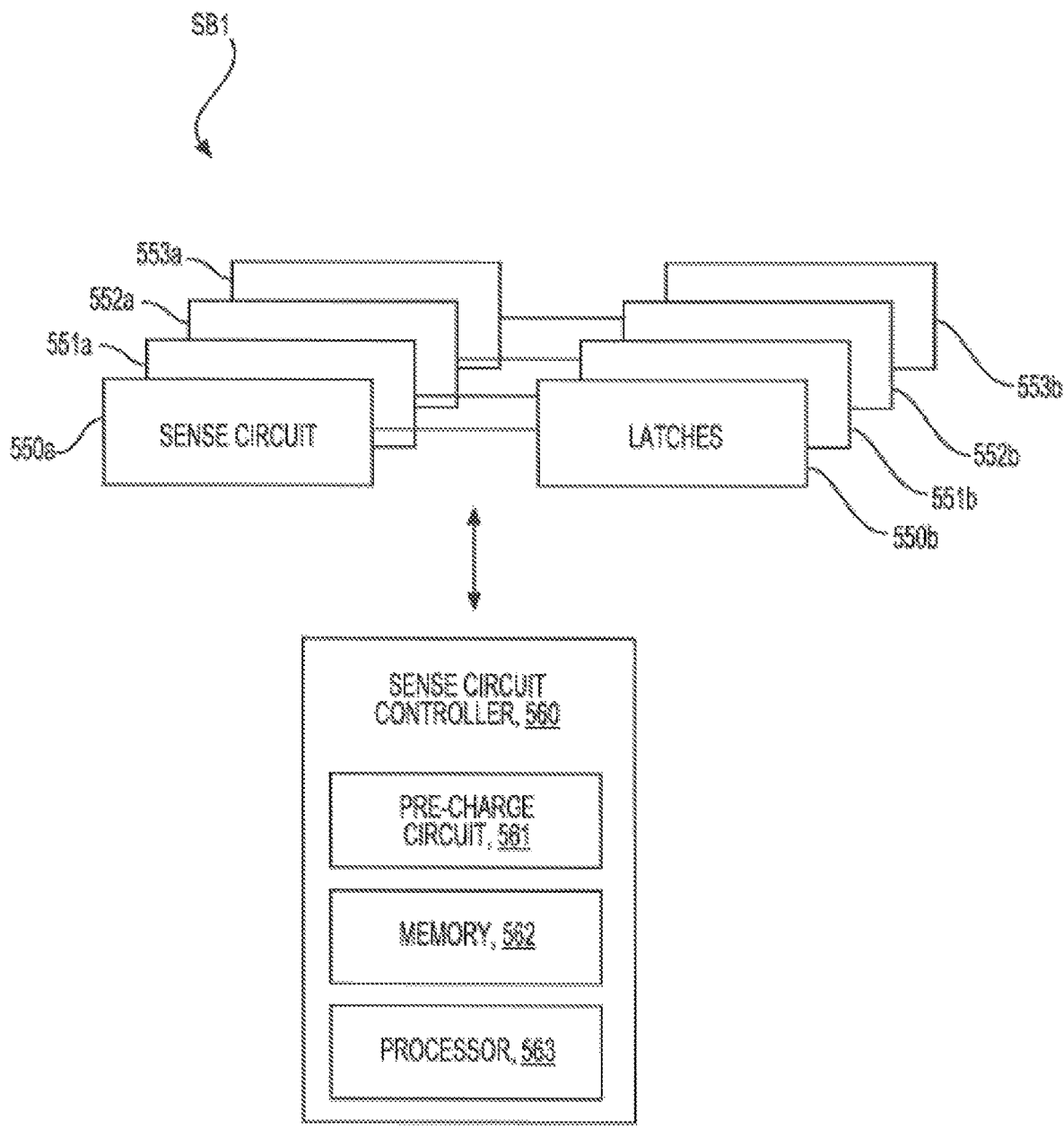
FIG. 5 illustrates an example block diagram of the sense block of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
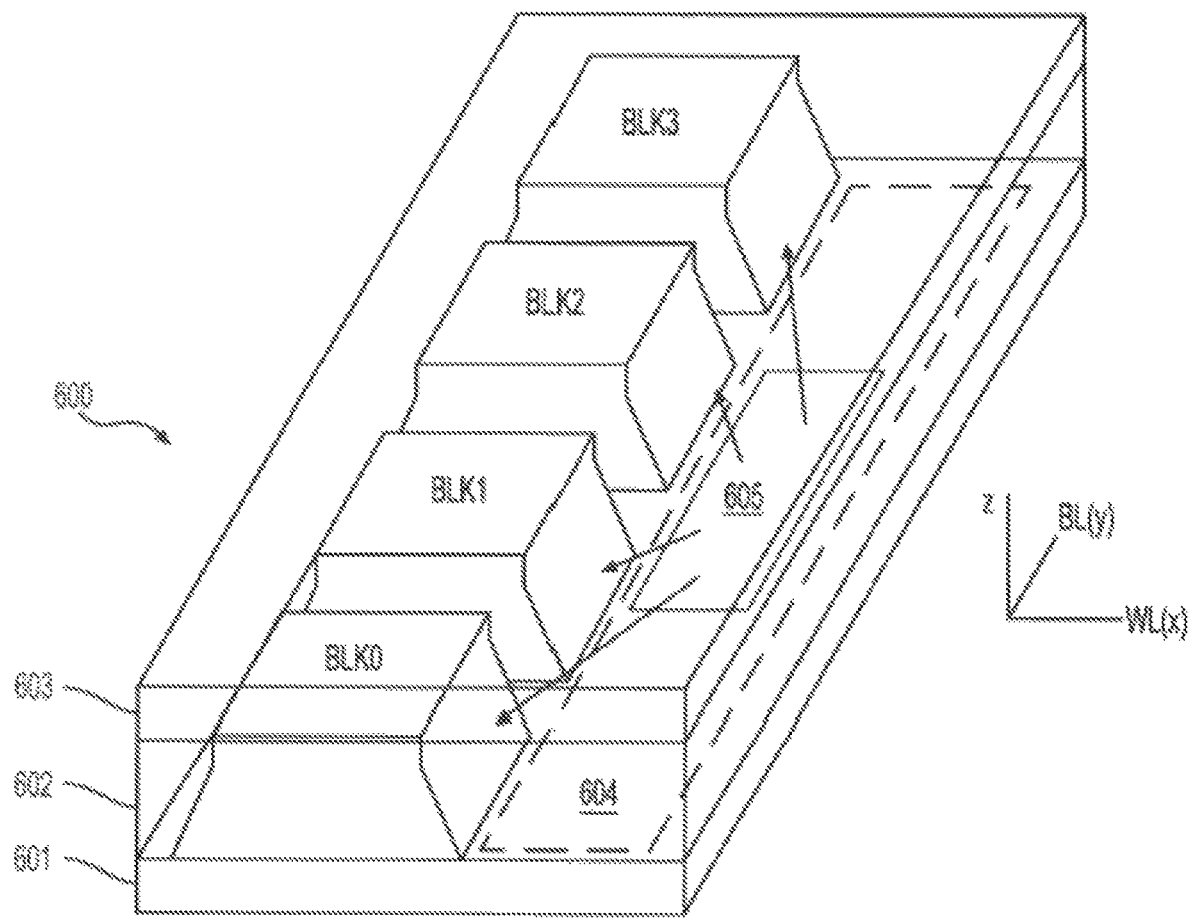
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
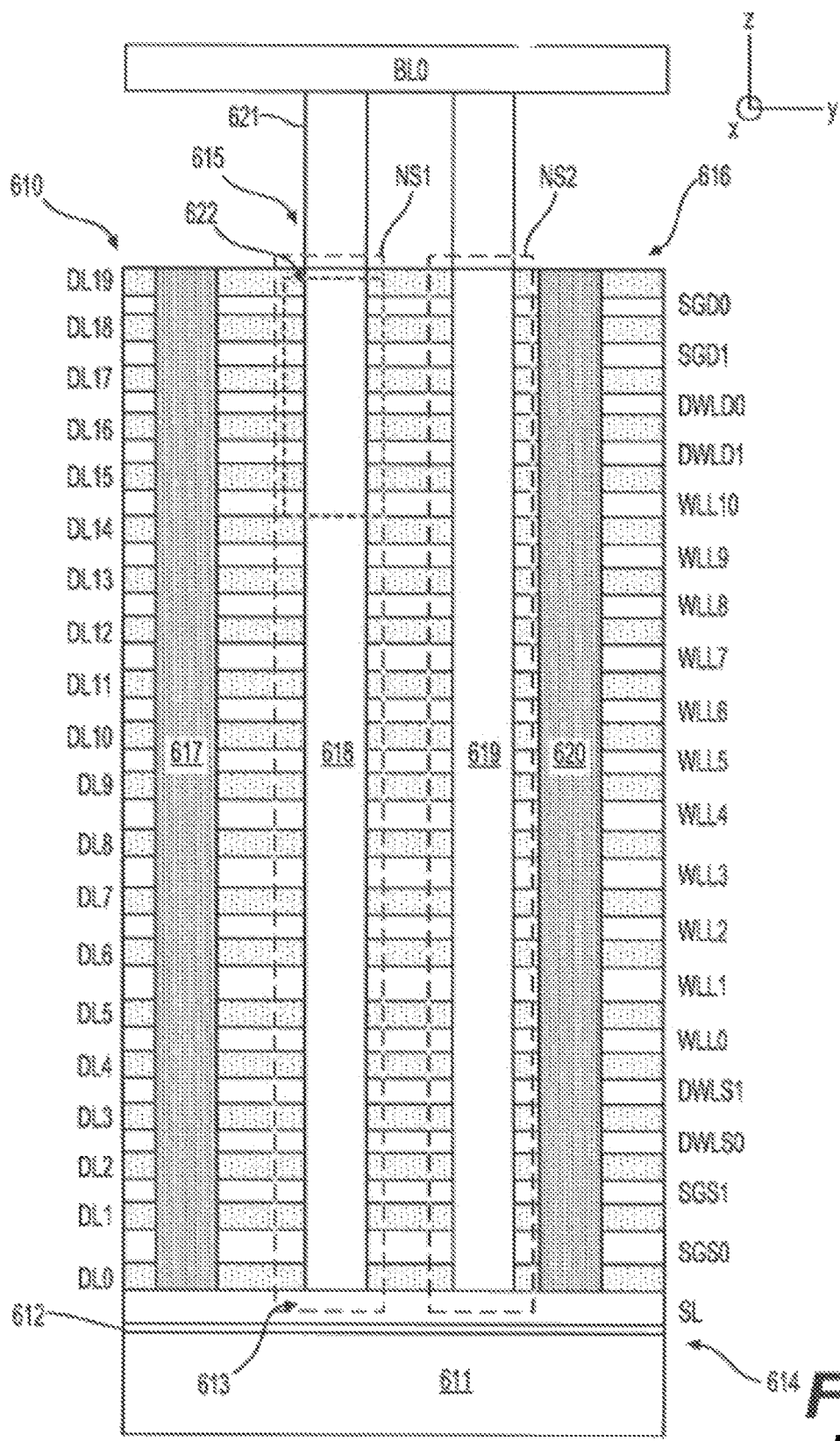
FIG. 6B illustrates an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
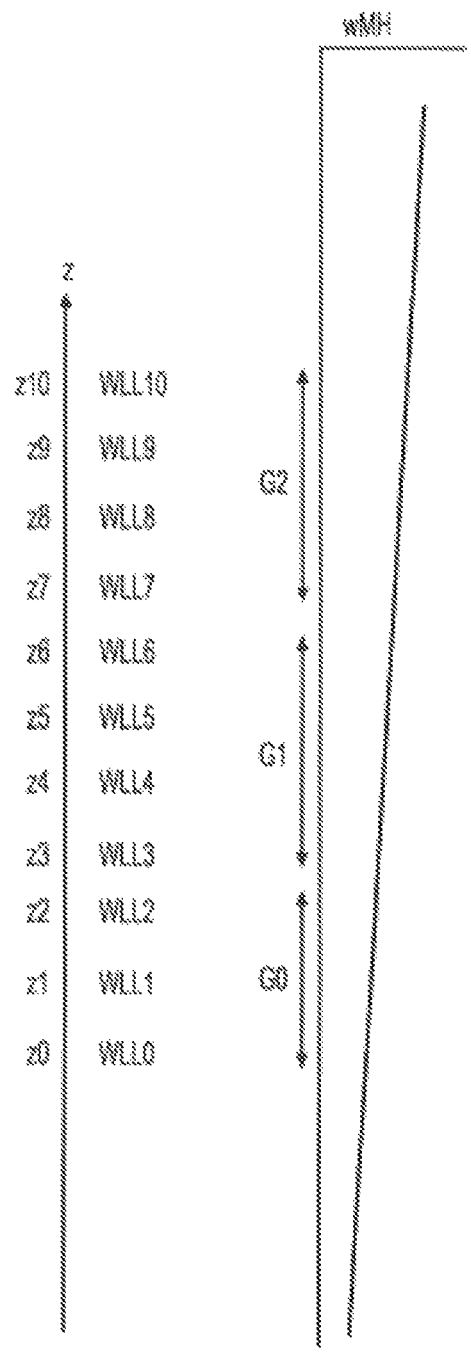
FIG. 6C illustrates a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
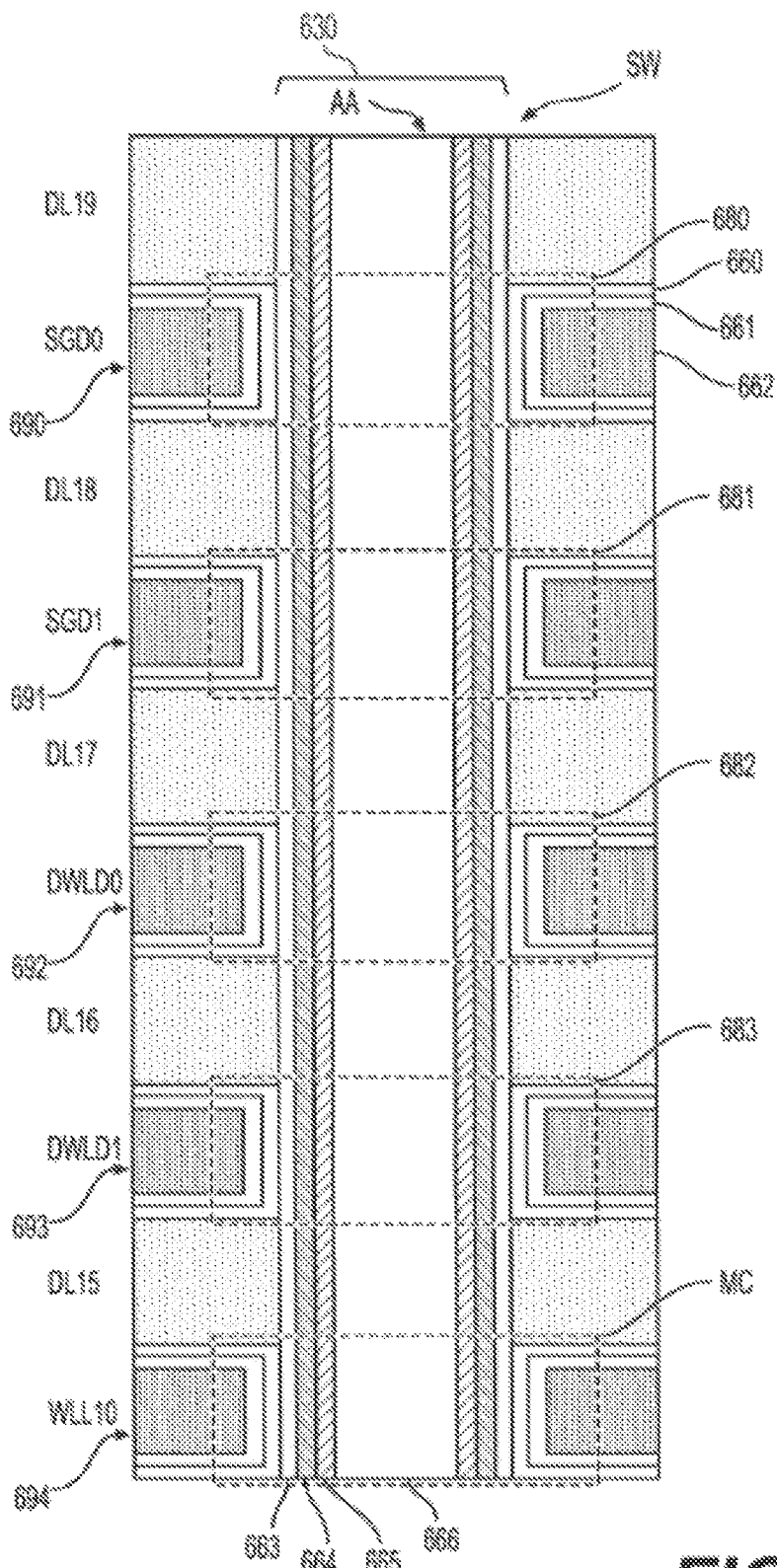
FIG. 6D illustrates a close-up view of the region of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7:
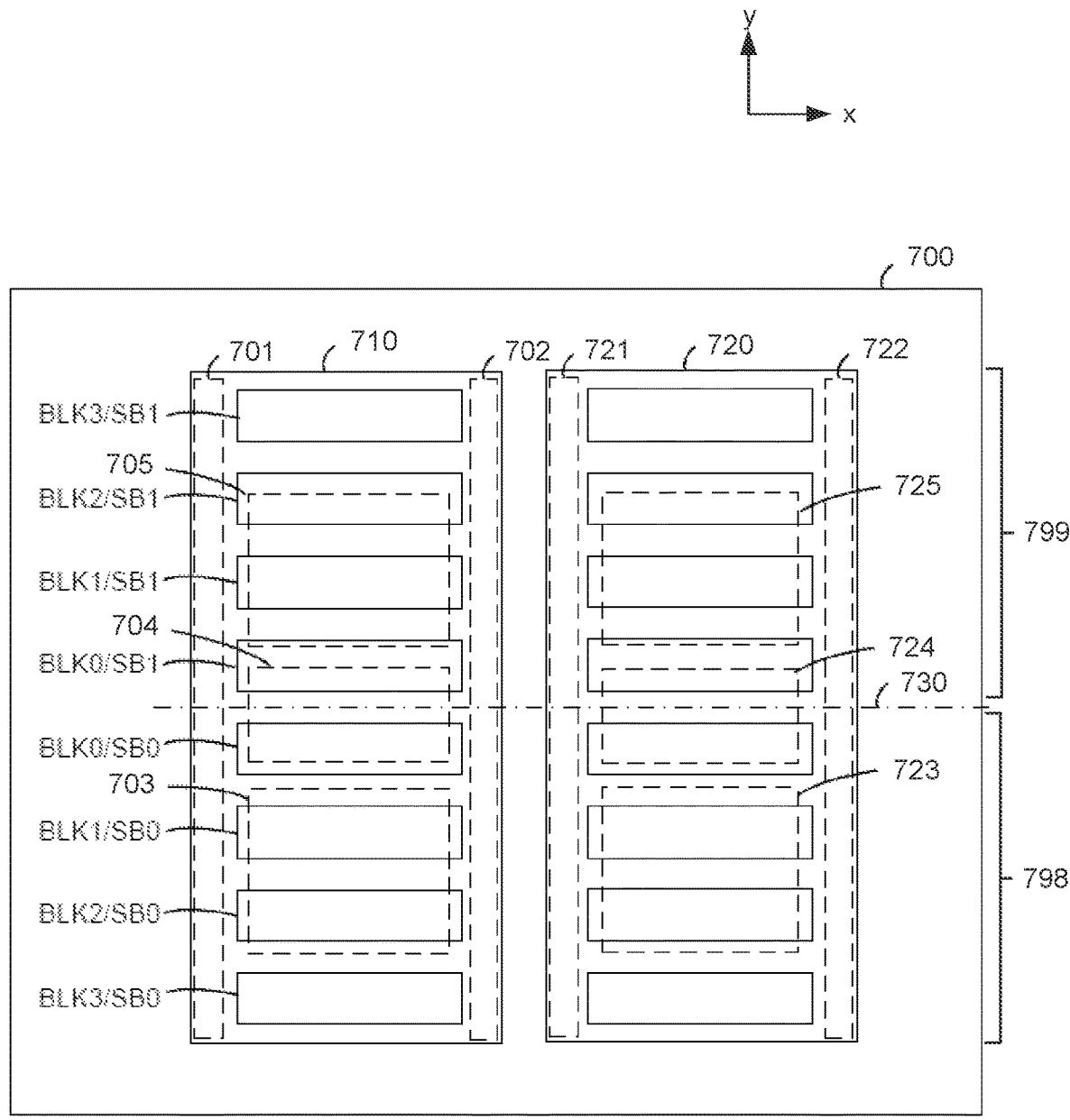
FIG. 7 illustrates a floorplan of a memory device comprising blocks arranged in two planes, where each block is divided into separate sub-blocks.

FIG. 7 depicts a floorplan of a memory device comprising blocks arranged in two planes, where each block is divided into separate sub-blocks. A first plane 710 and a second plane 720 are depicted. Each plane includes a first side 798 and a second side 799 on opposing sides of an imaginary dividing line 730. The line can be a central point which divides the planes in half in the y direction, for example. The y direction is a direction in which bit lines extend. Each block includes a sub-block on the first side and a sub-block on the second side. A first set of bit lines can extend on the first side while a second set of bit lines extends on the second side.

For example, in the first plane 710, a block BLK0 includes a first sub-block BLK0/SB0 on the first side 798 and a second sub-block BLK0/SB1 on the second side 799. A block BLK1 includes a first sub-block BLK1/SB0 on the first side 798 and a second sub-block BLK1/SB1 on the second side 799. A block BLK2 includes a first sub-block BLK2/SB0 on the first side 798 and a second sub-block BLK2/SB1 on the second side 799. A block BLK3 includes a first sub-block BLK3/SB0 on the first side 798 and a second sub-block BLK3/SB1 on the second side 799. The first sub-blocks of the blocks are arranged laterally one after the other in the −y direction on the plane, while the second sub-blocks of the blocks are arranged laterally one after the other in the opposite, y direction on the plane. Each block may be considered to be a logical block as it is divided into separate sub-blocks, where each sub-block comprises an independent set of word lines, an independent set of word line switching transistors, and is connected to an independent set of bit lines. The sub-blocks of a block are related in that they receive common word line voltage signals from a common row decoder. Each block may have a separate row decoder.

For the blocks in the plane 710, regions 701 and 702 can be used for circuitry including word line switching transistors. Further, a region 703 on the first side can include sense circuits for the sub-blocks on the first side, while a region 705 on the second side can include sense circuits for the sub-blocks on the second side. A region 704 which is centrally located in the plane, in one approach, can be used for circuitry such as row decoders, a column decoder and analog circuits. In one approach, the regions 703-705 are on a second die while the blocks are on a first die 700. The second die is under the first die. This approach provides greater flexibility in locating the circuitry, compared to an approach in which the circuitry is on the same die as the blocks of memory cells.

The second plane 720 can include a similar arrangement of sub-blocks and circuitry. Specifically, for the blocks in the plane 720, regions 721 and 722 can be used for circuitry including word line switching transistors. A region 723 on the first side can include sense circuits for the sub-blocks on the first side, while a region 725 on the second side can include sense circuits for the sub-blocks on the second side. A region 724 can be used for circuitry such as row decoders, a column decoder and analog circuits.

Figure 8A:
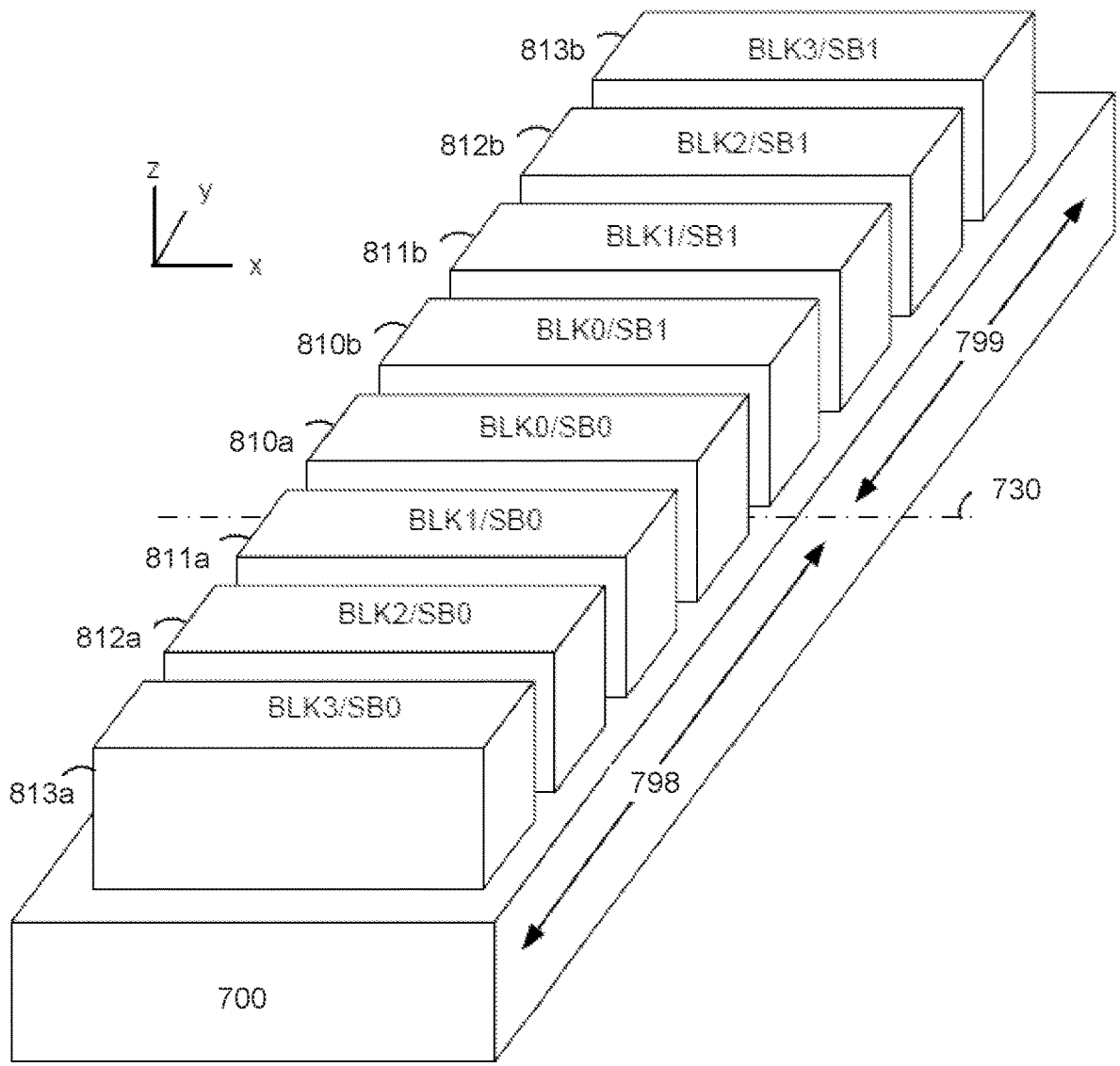
FIG. 8A illustrates an example perspective view of blocks arranged in a plane, consistent with FIG. 7, where each block comprises two separate sub-blocks, and the blocks and associated circuitry are on a common die.

FIG. 8A depicts an example perspective view of blocks arranged in a plane, consistent with FIG. 7, where each block comprises two separate sub-blocks, and the blocks and associated circuitry are on a common die 700. As depicted in FIG. 7, the sub-blocks can be arranged laterally, one after another, on a substrate on both sides of the dividing line 730. A first side 798 on one side of the dividing line 730 includes the first sub-blocks 810a-813a, e.g., BLK0/SB0-BLK3/SB0, respectively. A second side 799 on an opposite side of the dividing line 730 includes the second sub-blocks 88b-813b, e.g., BLK0/SB1-BLK3/SB1, respectively.

Figure 8B:
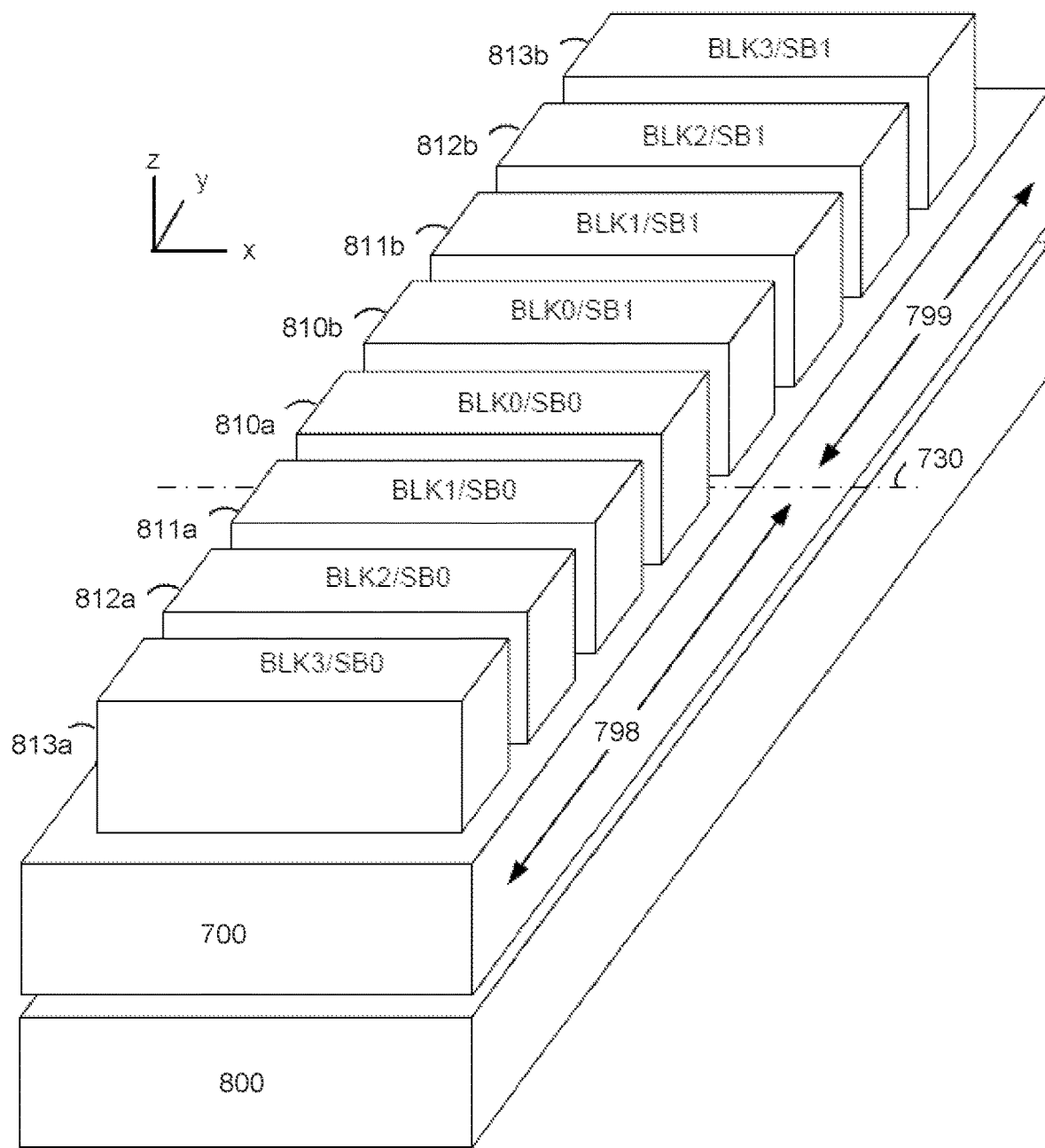
FIG. 8B illustrates an example perspective view of blocks arranged in a plane, consistent with FIG. 7, where each block comprises two separate sub-blocks, the blocks are arranged on a first die 900, and associated circuitry is arranged on a second die.

FIG. 8B depicts an example perspective view of blocks arranged in a plane, consistent with FIG. 7, where each block comprises two separate sub-blocks. The blocks 810-813 are arranged on a first die 700, and associated circuitry is arranged on a second die 800. By arranging the circuitry, which may include the word line switching transistors, on a second die 800 while the blocks 810-813 of memory cells are on a first die 700, additional space is obtained for the circuitry. This facilitates the provision of independent sets of word line switching transistors for each sub-block or pair of sub-blocks. The two dies 700, 800 are bonded together, such that conductive paths can extend between the word lines and the word line switching transistors. The single-die approach of FIG. 8A is also feasible and may be less complex but generally has an extra space requirement.

Figure 9:
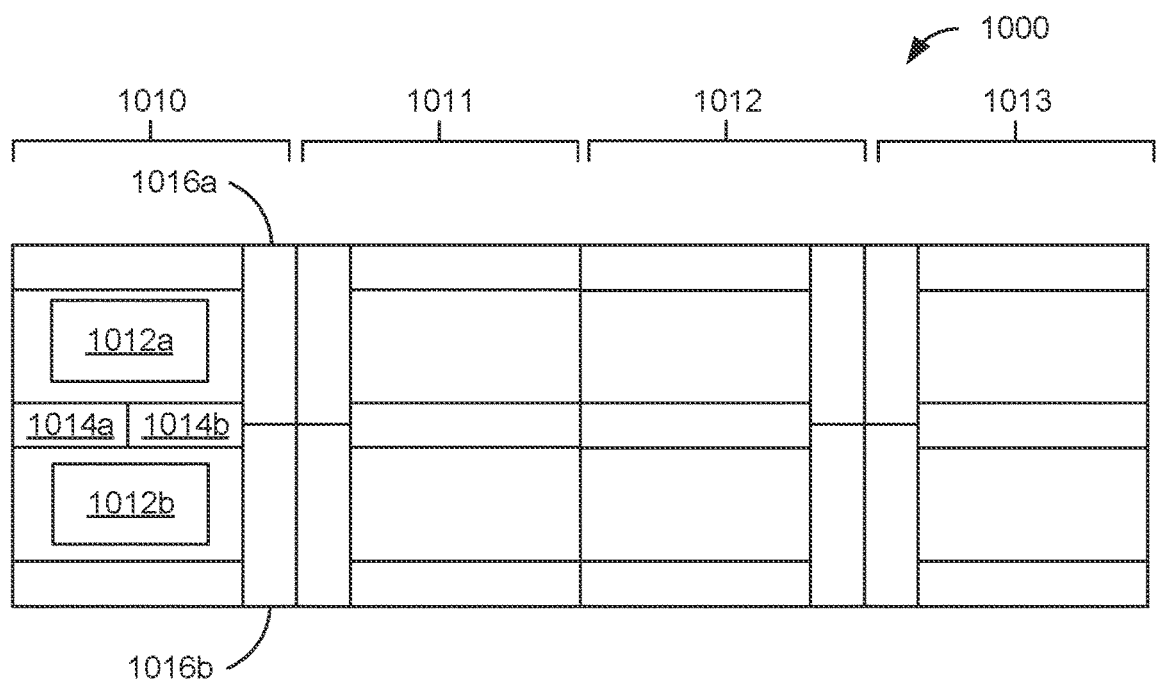
FIG. 9 illustrates a diagram of a memory system with several planes, in accordance with some described embodiments.

FIG. 9 illustrates a diagram of a memory system 1000 with several planes, in accordance with some described embodiments. For purposes of simplicity and illustration, some features of the memory system 1000 are removed. The memory system 1000 may include several planes, such as a plane 1010, a plane 1011, a plane 1012, and a plane 1013. Each of the planes 1010, 1011, 1012, and 1013 are part of a die (not shown in FIG. 10) and may include one or more sub-blocks similar to the die 700 shown in FIG. 7. For example, the plane 1010 includes a sub-block 1012a and a sub-block 1012b. Additionally, the plane 1010 may include row decoder 1014a and 1014b (representative of additional row decoders), as well as word line switch transistors 1016a and 1016b (representative of additional word line switch transistors). Although not shown, the planes 1011, 1012, and 1013 may include any features shown and described for the plane 1010.

Figure 10:
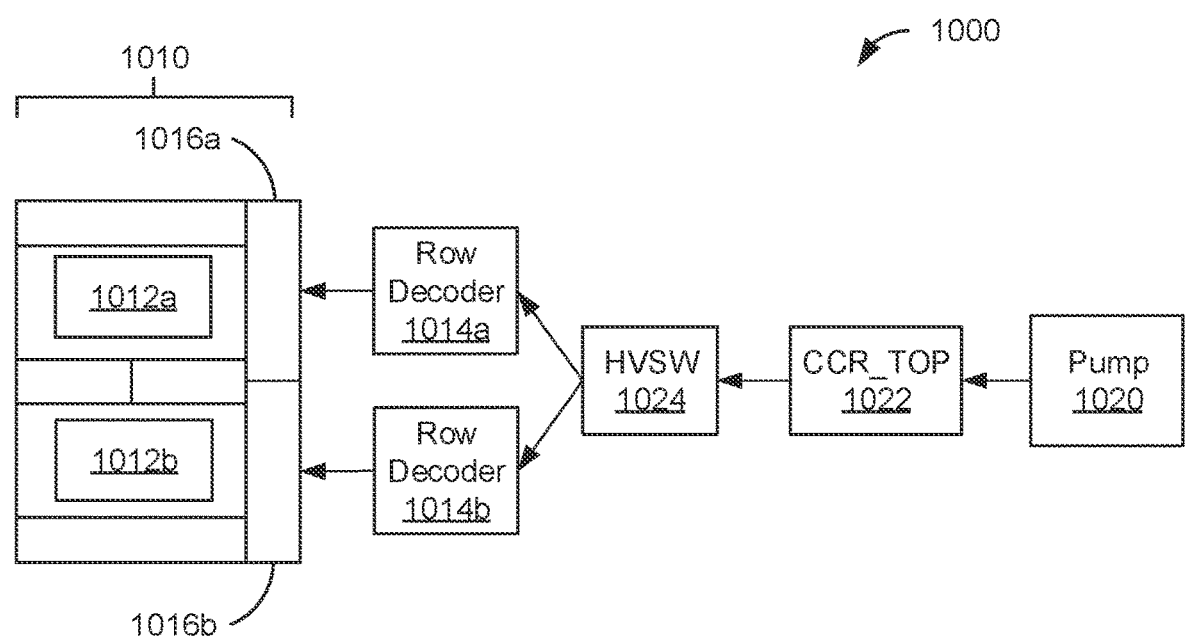
FIG. 10 illustrates a schematic diagram showing additional features of the memory system, in accordance with some described embodiments.

Using multiple row decoders and word line switch transistors, the sub-blocks 1012a, 1012b of the plane 1010 can be read at different times. For example, FIG. 10 illustrates a schematic diagram showing additional features of the memory system 1000, in accordance with some described embodiments. As shown, the memory system 1000 includes a voltage pump 1020 designed to adjust the voltage to a desired setting. The pump 1020, or charge pump, can supply voltage to a CCR TOP 1022 (i.e., a multiplexer), wherein the voltage can be provided to multiple word lines of the plane 1010. Prior to the voltage being supplied to the word lines of the plane 1010, the memory system 1000 further includes a high voltage switching transistor 1024 ("HVSW") and the row decoders 1014a and 1014b. The HVSW 1024 can be used to switch and provide voltage to row decoders 1014a and 1014b, which can subsequently supply voltage to the word line switch transistors 1016a and 1016b. The row decoder 1014a can provide a voltage to the word line switch transistor 1016a, which subsequently transmits the voltage to the sub-block 1012a. This process can be done independently of the row decoder 1014b and the word line switch transistor 1016b. Conversely, the row decoder 1014b can provide a voltage to the word line switch transistor 1016b, which subsequently transmits the voltage to the sub-block 1012b. This process can be done independently of the row decoder 1014a and the word line switch transistor 1016a.

In this manner, certain operations can occur not only independently, but also at different times. For example, during a read operation, the row decoder 1014b can provide a voltage to the word line switch transistor 1016b at time $t_1$ to read the sub-block 1012a. Then, at some subsequent time $t_2$, the row decoder 1014b can provide a voltage to the word line switch transistor 1016b to read the sub-block 1012b. Accordingly, the time interval between $t_1$ and $t_2$ represents a time delay that can be used to mitigate/reduce peak Icc during the read operation.

FIG. 11 illustrates a table 1100 showing exemplary time delays, in accordance with some described embodiments. It should be noted that the time delay operation can be disabled or enabled based on, for example, a parameter setting. A time delay for a read operation can be applied to each of the sub-block of the planes on a die. When the operation is disabled, a standard read operation occurs and the sub-blocks can be read simultaneously. However, when the operation is enabled, the time delay selected from the table 1200 can be applied, thereby allow sub-blocks in each of the planes to undergo a desired time delay, and a time delay is applied between sub-blocks. In other words, while the planes on a die are read together (i.e., simultaneously), at least two sub-blocks on a plane can be read at different times based on the time delay. Accordingly, sub-blocks on a plane can be read at different times. Further, some sub-blocks on one plane can be read at a later time, based on the time delay, than some sub-blocks on another plane.

The table 1100 represents exemplary time delays using bits [0], [1], [2], and [3]. These bits represent a 4-bit parameter. However, it should be noted that a different number of bits (i.e., more or less bits) are possible in other embodiments. The time column of the table 1100 represents a time delay x (e.g., in the range of 5 to 10 microseconds, or µs) and multiples of x. Additionally, a "0" or a "1" in the columns represents a binary code to determine the time delay to apply to the sub-blocks in the planes. As an example, when the 4-parameter reads 0 0 0 0, the time delay is x. However, when the time delay is 0 1 1 1, the time delay is 8x. The selected time delay can be applied a pair of sub-blocks on each side of the (enabled) plane. For example, the sub-blocks BLK1/SB0 and BLK1/SB1 in FIG. 7 represent a pair of sub-blocks on a first side 798 and a second side 799, respectively, of the first plane 710. The table 1100 is exemplary and other possibilities exist.

Figure 12:
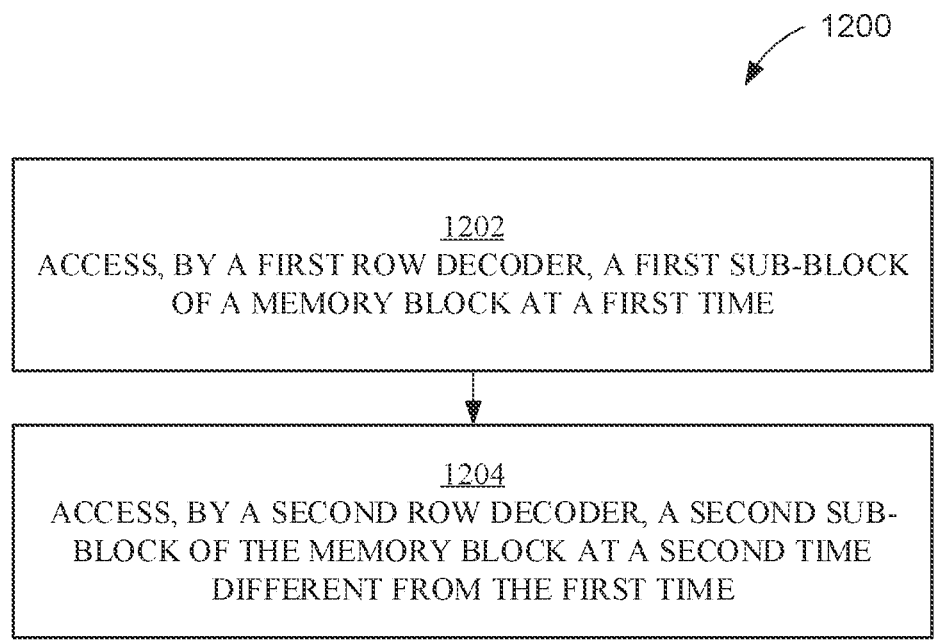
FIG. 12 illustrates a flowchart showing a method for optimizing an operation of a memory device, in accordance with some described embodiments.

FIG. 12 illustrates a flowchart 1200 showing the steps of a method for optimizing an operation of a memory device, in accordance with some described embodiments. An example, memory system used to carry out the steps of the flowchart 1200 is described above. In this regard, the memory system may include multiple sub-blocks, with each sub-block having an associated row decoder and word line switch transistor.

In step 1202, a first row decoder accesses a first sub-block of a memory block at a first time. The first sub-block and a second sub-block (discussed below) may be part of a memory block on a plane.

In step 1204, a second row decoder accesses a second sub-block of the memory block at a second time, which is different from the first time. The second time may represent a subsequent time, and accordingly, a delayed time. In this manner, the second sub-block can be read after the first sub-block based on the time delay. The time delay operation can be integrated when the read operation enables the operation.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for optimizing an operation of a memory device, the method comprising the steps of:

accessing, by a first row decoder coupled to a first sub-block of a first memory block, the first sub-block of the first memory block at a first time; and accessing, by a second row decoder separate from the first row decoder and coupled to a second sub-block of the first memory block, the second sub-block of the first memory block at a second time that is different from the first time, wherein the second time defines a time delay that is chronologically after the first time, and wherein the time delay is determined based upon a word line voltage ramp rate control.

2. The method according to claim 1, wherein:

accessing the first sub-block comprises reading the first sub-block at the first time; and accessing the second sub-block comprises reading the second sub-block at the second time.

3. The method according to claim 1, wherein accessing the first sub-block comprises providing, by the first row decoder, voltage to a first switch transistor.

4. The method according to claim 1, wherein the first sub-block is located on a first plane, and the second sub-block is located on a second plane.

5. The method according to claim 1, further comprising the step of providing, by a voltage switch transistor, voltage to the first row decoder and the second row decoder.

6. A memory system, comprising:

a memory device;

a first row decoder coupled to a first sub-block of a first memory block;

a second row decoder, separate from the first row decoder, coupled to a second sub-block of the first memory block; and a controller operatively coupled to the memory device, the controller being configured to:

access, by the first row decoder, the first sub-block of the first memory block at a first time; and access, by the second row decoder, the second sub-block of the first memory block at a second different from the first time, wherein the second time defines a time delay that is chronologically after the first time, and wherein the time delay is determined based upon a word line voltage ramp rate control.

7. The memory system according to claim 6, wherein the controller is further configured to:

read the first sub-block at the first time; and read the second sub-block at the second time.

8. The memory system according to claim 6, wherein the controller is further configured to provide, using the first row decoder, voltage to a first switch transistor.

9. The memory system according to claim 6, wherein the first sub-block is located on a first plane, and the second sub-block is located on a second plane.

10. The memory system according to claim 6, wherein the controller is further configured to provide, using a voltage switch transistor, voltage to the first row decoder and the second row decoder.

11. A non-transitory computer readable storage medium configured to store instructions that, when executed by a processor includes a controller of a memory system, cause the memory system to carry out steps to:

access, by a first row decoder coupled to a first sub-block of a first memory block, the first sub-block of the first memory block at a first time; and access, by a second row decoder separate from the first row decoder and coupled to a second sub-block of the first memory block, the second sub-block of the first memory block at a second different from the first time, wherein the second time defines a time delay that is chronologically after the first time, and wherein the time delay is determined based upon a word line voltage ramp rate control.

12. The non-transitory computer readable storage medium according to claim 11, wherein the controller is further configured to:

read the first sub-block at the first time; and read the second sub-block comprises reading the second sub-block at the second time.

13. The non-transitory computer readable storage medium according to claim 11, wherein the controller is further configured to provide, using the first row decoder, voltage to a first switch transistor.

14. The non-transitory computer readable storage medium according to claim 11, wherein the first sub-block is located on a first plane, and the second sub-block is located on a second plane.

* * * * *